United States Patent [19]

Suzuki et al.

[11] Patent Number: 5,169,508
[45] Date of Patent: Dec. 8, 1992

[54] GRAPHITE ELECTRODE

[75] Inventors: Tomonari Suzuki, Kashihara; Hiroshi Wada, Nara; Yoshikazu Yoshimoto, Tenri; Masaru Yoshida, Nara, all of Japan

[73] Assignee: Sharp Kabushiki Kaisha, Osaka, Japan

[21] Appl. No.: 738,615

[22] Filed: Jul. 31, 1991

Related U.S. Application Data

[62] Division of Ser. No. 318,339, Mar. 3, 1989, Pat. No. 5,068,126.

[30] Foreign Application Priority Data

Mar. 4, 1988 [JP] Japan ................................ 63-51821

[51] Int. Cl.$^5$ .................. C25B 11/12; H01M 4/02
[52] U.S. Cl. ...................... 204/290 R; 204/294; 429/209
[58] Field of Search ............ 427/122, 249, 250; 204/290 R, 294; 429/209

[56] References Cited

U.S. PATENT DOCUMENTS

| | | | |
|---|---|---|---|
| 1,897,933 | 2/1933 | Guthrie | 427/249 |
| 3,725,110 | 4/1973 | Rodgers | 427/249 |
| 3,769,084 | 10/1973 | Saito et al. | 204/38 R |
| 3,924,031 | 12/1975 | Nicholas | 427/250 |
| 3,944,686 | 3/1976 | Froberg | 427/122 |
| 3,969,130 | 7/1976 | Bokros | 427/249 |
| 4,645,713 | 2/1987 | Shioya | 427/122 |
| 4,707,384 | 11/1987 | Schachner | 427/250 |

FOREIGN PATENT DOCUMENTS

| | | | |
|---|---|---|---|
| 39527 | 9/1984 | Japan | 427/249 |
| 61-27503 | 2/1986 | Japan . | |
| 2086943 | 5/1982 | United Kingdom | 427/249 |

OTHER PUBLICATIONS

M. Miyake "Chemical Vapor Deposition of Niobium on Graphite" Thin Solid Films 63, 1979 pp. 303–308.

*Primary Examiner*—John Niebling
*Assistant Examiner*—Kathryn Gorgos
*Attorney, Agent, or Firm*—Birch, Stewart, Kolasch & Birch

[57] ABSTRACT

A graphite electrode includes a first step of a substrate a deposition layer of fine globular graphite particles on the substrate, and subsequently a metal film of an iron group element or an alloy thereof on the deposition layer, and then a graphite layer on the metal film to obtain the electrode.

16 Claims, 2 Drawing Sheets

F I G . 3
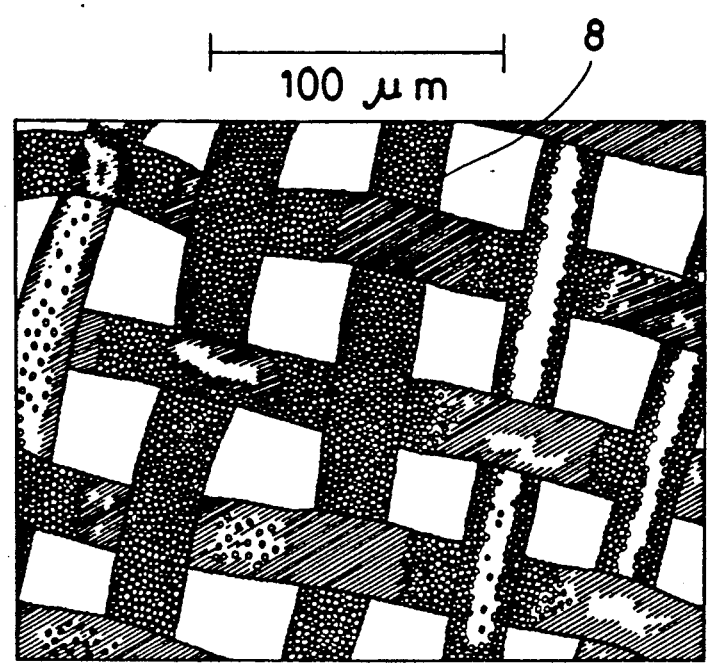

GRAPHITE ELECTRODE

This application is a divisional of now allowed application Ser. No. 07/318,339 filed on Mar. 3, 1989, now U.S. Pat. No. 5,068,126.

BACKGROUND OF THE INVENTION

1. Field of the Invention

The present invention relates to a process for producing graphite electrodes, and more particularly to a process for efficiently producing graphite electrodes for thin batteries which are suitable as power sources for various electronic devices of small size or thickness.

2. Description of the Prior Art

In preparing graphite electrodes for thin batteries or the like, iron group elements are usually used as the substrate material for depositing graphite thereon by thermal decomposition since these elements act catalytically in the thermal decomposition of various hydrocarbon compounds and further ac to promote graphitization of carbon (Journal of Catalysis, 29, 15–19(1973), Carbon, 10, 601–611(1972)). However, when the substrate is in the form having a small specific surface area such as a common plate, it is impossible to achieve a high enough deposition rate of graphite for practical use. The rate does not become high enough even if a reticular substrate is used. Accordingly, sponge metals having a large specific surface area are used solely as substrates. For example, a vapor growth process is known wherein graphite is deposited on sponge nickel by thermal decomposition (Unexamined Japanese Patent Publications SHO63-102167 and SHO 63-230512).

Nevertheless, such a usual process for preparing graphite electrodes involves difficulty in controlling the amount of deposition of graphite on the surface of sponge metal because of great variations in the specific surface area thereof. Consequently, the graphite electrodes obtained vary greatly in characteristics and are not satisfactorily usable.

Further, for the efficient growth of graphite on the surface of sponge nickel substrate, the substrate needs to have a considerably large overall surface area and must, therefore, have a thickness at least over 1 mm. In order to obtain thin electrodes, accordingly, the product of the process needs to be pressed eventually to the thickness, and the pressing step breaks or releases the graphite layer formed resulting in the problem of reduced capacity of the graphite electrode.

The present invention, which has been accomplished to overcome the foregoing problems, contemplates provision of a process for producing with ease and efficiently graphite electrodes having a high capacity and below 1 mm in thickness.

From the above viewpoint, we have conducted intensive research and, consequently, prepared a graphite electrode by forming on a substrate a deposition layer of fine globular graphite particles larger than usual graphite particles formed on an electrode substrate, covering the deposition layer with a thin metal film of an iron group element or the like to form a surface having minute projections, and forming a usual graphite layer on the surface by the thermal decomposition CVD process. We have found that this graphite layer can be formed at a remarkably improved deposition rate and have accomplished the present invention.

SUMMARY OF THE INVENTION

Accordingly, the present invention provides a process for producing a graphite electrode which includes forming a deposition layer of fine globular graphite particles on a substrate, and performing on the deposition layer at least one of a laminating step of forming a metal film and, subsequently forming a graphite layer on the metal film, to obtain an electrode having one or more of the graphite layers supported on the substrate.

The deposition layer of fine globular graphite particles formed on the substrate has a surface with a multiplicity of projections, which gives a greatly increased surface area to the metal film covering the deposition layer. It is thought that the rate of deposition of the graphite layer can be remarkably increased by the increased surface area despite the shape of the substrate. For example, the deposition rate can be increased to about 10 to about 15 times the rate conventionally possible.

With the process of the invention for producing graphite electrodes, the graphite layer can be formed at a high deposition rate on an electrode substrate in the form of a plate, rod, foil, reticular plate, net or the like and having a small surface area. Accordingly, graphite electrodes of high capacity can be produced efficiently without use of the sponge metal. Since there is no need to use the sponge metal, thin electrodes below 1 mm in thickness can be prepared with ease without resorting to a pressing step, while it is possible to eliminate variations in characteristics or to preclude the decrease in capacity due to the release of graphite in the pressing step.

BRIEF DESCRIPTION OF THE DRAWINGS

FIG. 3 is an enlarged perspective view showing the surface of a deposition layer of fine globular graphite particles formed on a nickel net by the embodiment (a sketch of photomicrograph, the blank stripes being due to reflection of light).

DESCRIPTION OF THE PREFERRED EMBODIMENT

Figure 1:
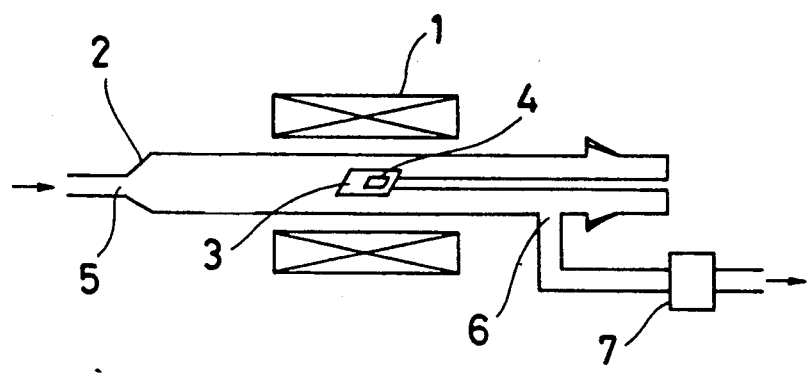
FIG. 1 is a schematic diagram showing an apparatus for use in an embodiment of the invention.

According to the present invention, a deposition layer of fine globular graphite particles is first formed on an electrode substrate. Electrically conductive materials are useful as a substrate. Among these, desirable are iron group elements and alloys thereof such as stainless steel, ferroalloys, Monel metals, permalloy, Ni—Mo alloys, Fe—Co alloys, alloys having superhigh resistance to heat, Co—Ni alloys and Co—Cr—W—Mo alloys, because these metals or alloys exhibit catalytic activity On the thermal decomposition reaction of hydrocarbons and further promote graphitization of carbon. The substrate can be in various shapes in conformity with the shape of the electrode to be produced. For example, it is in the form of a plate, rod, foil, net or the like, Also usable when desired are porous metals or alloys, such as sponge metals, obtained by sintering or blowing.

The term "fine globular graphite particles" as used herein refers to graphite particles having relatively large sizes of about 1 to about 10 μm. The deposition layer may be in the form of a single layer of such graphite particles. The deposition layer of fine globular graphite particles can be formed, for example, by thermal decomposition chemical vapor deposition from benzene, propane or like hydrocarbon, especially by feeding an increased concentration of hydrocarbon starting material at a low rate in the thermal decomposition CVD process. For example, a deposition layer of fine globular graphite particles, several micrometers in size, can be formed efficiently from a hydrocarbon having a molecular weight of up to 150 by using a common thermal decomposition CVD apparatus under the conditions of hydrocarbon feed rate of 0.005 to 1.5 mole/hour, molecular number density of $1.3 \times 10^{22}$ to $2.6 \times 10^{22}$ molecules/liter, flow rate of 0.3 to 10 cm$^3$/min and thermal decomposition temperature of 450° to 1300° C., preferably 700° to 1200° C.

Then, the laminating step is performed once or a plurality of times over the deposition layer. This step comprises, in combination, forming a metal film of an iron group element or an alloy thereof and, subsequently, forming a graphite layer on the metal film. The metal film is formed on the deposition layer from an iron group element or an alloy thereof such as ferroalloy, Monel metal, permalloy, Ni—Mo alloy, Fe—Co alloy, Co—Ni alloy or Co—Cr—W—Mo alloy. It is suitable to form the metal film usually to a thickness of about 1 to about 10 μm, for example, by vacuum evaporation, sputtering or like PVD process, or plating.

While it is suitable to form the graphite layer on the metal film by the same thermal decomposition CVD process as above, the conditions therefor are not limited specifically by the conditions for forming the deposition layer of fine globular graphite particles. Various conditions can be employed which are generally useful for forming a graphite layer which exhibits satisfactory characteristics as the active component of the electrode. For example when a hydrocarbon compound having a molecular weight of up to 150 is used, the graphite layer can be formed efficiently under the conditions of hydrocarbon feed rate of 0.005 to 15 moles/hour, molecule number density of $0.5 \times 10^{21}$ to $2.6 \times 10^{22}$ molecules/liter, flow rate of 0.3 to 70 cm$^3$/min., and thermal decomposition temperature of 450° to 1300° C. (preferably 700° to 1200° C.). However, when the procedure for forming the graphite layer over the metal film is to be executed a plurality of times, it is desirable to form the graphite layer just underlying the uppermost metal film under the same conditions as the deposition layer of fine globular graphite particles to ensure an improved deposition rate.

The laminating step can be executed once or a plurality of times in accordance with the contemplated amount of graphite to be supported, the thickness of the electrode, etc. For example, when an especially thin graphite electrode is to be prepared, the step is conducted once, whereas when an electrode is to be produced with an increased amount of deposited graphite, the step is repeated several times until the specified amount of graphite is deposited.

Figure 2:
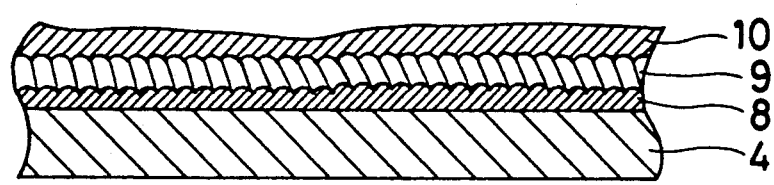
FIG. 2 is a view in section schematically showing a graphite electrode obtained by the embodiment.

FIG. 2 is a diagram showing a graphite electrode obtained by performing the laminating step over the deposition layer once. The diagram shows an electrode substrate 4, deposition layer 8 of fine globular graphite particles, film 9 of iron group element or alloy thereof, and graphite layer 10.

The graphite electrode thus obtained can be used as an electrode for a battery, especially as a negative electrode for a lithium secondary battery.

EXAMPLE 1

FIG. 1 is a diagram schematically showing a thermal decomposition CVD apparatus for use in embodying the invention. A reaction table 3 is provided within a reactor tube 2 extending through an oven 1 and having a hydrocarbon feed inlet 5 and an exhaust outlet 6 extending to a vacuum device 7. An electrode substrate 4 in the form of a nickel net and measuring 10 mm × 10 mm × 100 μm (thickness) was placed on the table 3, and the interior of the reactor tube 2 was heated to 900° C. Next, benzene was supplied to the reactor tube 2 under the conditions of a feed rate of 0.15 mole/hour, flow rate of 0.7 cm$^3$/min and molecular number density of $1.5 \times 10^{22}$ molecules/liter for about 10 minutes, in accordance with the thermal decomposition CVD, whereby a deposition layer of fine globular graphite particles, about 1 to about 3 μm in diameter, was formed on the substrate 4 (i.e., nickel net) as seen in the sketch of photomicrograph of FIG. 3.

Next, nickel was deposited by sputtering on the deposition layer to a thickness of 8 μm to form a nickel film. A graphite layer, weighing 10 mg, was then formed on the nickel film by depositing graphite for 20 minutes under the same conditions as employed for forming the deposition layer with the exception of changing the feed rate from 0.15 mole/hour to 1.5 mole/hour, the flow rate from 0.7 cm$^3$/min to 1.5 cm$^3$/min, the molecule number density from $1.5 \times 10^{22}$ molecules/liter to $1.0 \times 10^{22}$ molecules/liter, and the reaction temperature from 900° C. to 950° C. The graphite deposition rate was as high as 20 mg/hour on the average. The graphite electrode obtained was 0.12 mm in thickness and was found suitable for thin batteries.

EXAMPLE 2

The same procedure as in Example 1 was repeated except that a nickel film was formed by electroplating after a deposition layer of fine globular graphite particles was formed on a nickel net in the same manner as in Example 1. The graphite deposition rate and the electrode thickness were comparable to the corresponding values obtained in Example 1.

EXAMPLE 3

A graphite deposition layer, weighing 10 mg, was formed in the same manner as in Example 1 with the exception of using 50-μm-thick iron foil in place of the 100-μm-thick nickel net as the electrode substrate and propane in place of benzene, and changing some of the conditions for forming the deposition layer on the substrate, i.e. changing the internal temperature of the reactor from 900° C. to 950° C., the molecule number density from $1.5 \times 10^{22}$ molecules/liter to $2.3 \times 10^{22}$ molecules/liter and the deposition time from about 10 minutes to about 15 minutes. The graphite deposition rate was as high as 13 mg/hour on the average. The electrode had a thickness of 0.07 mm and was found suitable for thin batteries.

COMPARATIVE EXAMPLE 1

A graphite layer was formed on an electrode substrate in the same manner as in Example 1 with the exception of changing the feed rate from 0.15 mole/hour to 1.5 mole/your, the flow rate from 0.7 cm$^3$/min to 1.5 cm$^3$/min, the molecular number density from $1.5 \times 10^{22}$ molecules/liter to $1.0 \times 10^{22}$ molecules/liter, the reactor internal temperature from 900° C. to 950° C.

and the graphite deposition time from 10 minutes to 10 hours. No nickel was deposited on the graphite layer. The amount of graphite thus deposited was 10 mg. The graphite deposition rate achieved was as low as 1 mg/hour on the average and was not practically useful.

COMPARATIVE EXAMPLE 2

A graphite layer was formed on a piece of sponge nickel serving as an electrode substrate and measuring 10 mm×10 mm×2.0 mm (thickness) in the same manner as in Example 1 with the exception of changing the feed rate from 0.15 mole/hour to 1.5 mole/hour, the flow rate from 0.7 cm$^3$/min to 1.5 cm$^3$/min, the molecular number density from $1.5 \times 10^{22}$ molecules/liter to $1.0 \times 10^{22}$ molecules/liter, the reactor internal temperature from 900° C. to 950° C. and the graphite deposition time from 10 minutes to 30 minutes. No nickel was deposited on the graphite layer. The amount of graphite thus deposited was 10 mg, and the graphite deposition rate was as high as 20 mg/hour on the average. However, the electrode had a large thickness of 3.2 mm. When the electrode was pressed to a thickness of 0.2 mm for use in preparing thin batteries, the graphite layer was broken and locally dislodged.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What we claimed is:

1. A graphite electrode comprising a substrate and at least one three-layer stacked structure formed on said substrate,
    said three-layer stacked structure being composed of a deposition layer of fine globular graphite particles, a metal deposition layer formed on said deposition layer of fine globular graphite particles and a pyrolyzed graphite deposition layer formed on said metal layer.

2. The graphite electrode of claim 1, wherein said fine globular particles of said deposition layer have a size of from 1 to 10 μm.

3. The graphite electrode of claim 1, wherein said metal deposition layer is nickel or iron.

4. The graphite electrode of claim 1, wherein said metal deposition layer has a thickness of from 1 to 10 μm.

5. The graphite electrode of claim 1, wherein said substrate comprises an iron group element or an alloy thereof.

6. The graphite electrode of claim 1, wherein said substrate is in the form of a plate, rod, net or foil.

7. The graphite electrode of claim 1, wherein said substrate is in the form of a reticular plate.

8. The graphite electrode of claim 1, wherein said deposition layer of fine globular graphite particles is formed from a hydrocarbon serving as a material gas having a molecular weight of up to 150, using a thermal decomposition chemical vapor deposition apparatus under the conditions of a molecular number density of $1.3 \times 10^{22}$ molecules/liter and a flow rate of 0.3 to 10 cm/min.

9. The graphite electrode of claim 8, wherein said hydrocarbon is benzene or propane.

10. The graphite electrode of claim 1, wherein said pyrolyzed graphite deposition layer is formed from a hydrocarbon serving as a material gas having a molecular weight of up to 150, using a thermal decomposition chemical vapor deposition apparatus under the conditions of a molecular number density of $0.5 \times 10^{21}$ to $2.6 \times 10^{22}$ molecules/liter and a flow rate of 0.3 to 70 cm/mm.

11. The graphite electrode of claim 10, wherein said hydrocarbon is benzene or propane.

12. The graphite electrode of claim 1, wherein one three-layered stacked structure is formed on said substrate.

13. The graphite electrode of claim 1, wherein a plurality of said three-layered stacked structure is formed on said substrate.

14. The graphite electrode of claim 6, wherein said substrate is in the form of a net.

15. The graphite electrode of claim 1, wherein said metal deposition layer is an iron group element or an alloy thereof.

16. The graphite electrode of claim 1, wherein said electrode has a thickness of up to 1 mm.

* * * * *